United States Patent [19]

Clodgo et al.

[11] Patent Number: 4,606,998
[45] Date of Patent: Aug. 19, 1986

[54] BARRIERLESS HIGH-TEMPERATURE LIFT-OFF PROCESS

[75] Inventors: Donna J. Clodgo; Rosemary A. Previti-Kelly, both of Richmond; Erick G. Walton, South Burlington, all of Vt.

[73] Assignee: International Business Machines Corporation, Armonk, N.Y.

[21] Appl. No.: 728,072

[22] Filed: Apr. 30, 1985

[51] Int. Cl.$^4$ ............................................. H01L 21/28
[52] U.S. Cl. ..................... 430/312; 430/313; 430/314; 430/315; 430/316; 430/317; 430/323; 430/324; 430/326; 430/327; 430/329; 430/330; 430/328; 156/650; 156/652; 156/659.1
[58] Field of Search .............. 430/312, 313, 314, 315, 430/316, 317, 323, 324, 326, 327, 329, 330, 328; 156/650, 652, 659.1

[56] References Cited

U.S. PATENT DOCUMENTS

| 4,334,349 | 6/1982 | Aoyama et al. | |
| 4,353,778 | 10/1982 | Fineman et al. | 430/316 |
| 4,377,115 | 6/1982 | Ikeda et al. | |
| 4,428,796 | 1/1984 | Milgram | 430/317 |
| 4,451,971 | 6/1984 | Milgram | |
| 4,523,976 | 6/1985 | Bukhman | 430/317 |

OTHER PUBLICATIONS

A Negative Resist Process for Polyimide as Dielectric in Dual Layer Metal Structure Belani and Spoack, Natl. Semiconductor.
Polyimide Liftoff Technology for High Density LSI Metallization Homma et al.
Doublecoat Planar Polyimide Process, vol. 27, No. 2, Jul. 1984 IBM Technical Disclosure Bulletin.

*Primary Examiner*—John E. Kittle
*Assistant Examiner*—Patrick J. Ryan
*Attorney, Agent, or Firm*—Mark F. Chadurjian

[57] ABSTRACT

A lift-off metal deposition process in which a high temperature polyimide layer (i.e. a polyimide having a high imidization temperature) is applied to a first polyimide layer. The two layers are anisotropically etched through a photoresist mask to form vias in the first polyimide layer. After application of a metal layer, the high-temperature polyimide layer is lifted off the first polyimide layer, which remains as a passivation layer.

21 Claims, 8 Drawing Figures

4,606,998

BARRIERLESS HIGH-TEMPERATURE LIFT-OFF PROCESS

TECHNICAL FIELD

The invention relates to a method of forming metal layers under high-temperature conditions.

CROSS-REFERENCE TO RELATED APPLICATIONS

Reference is made to U.S. patent application Ser. No. 693,698, filed Jan. 22, 1985, entitled "Tailoring of Via Hole Sidewall Slope", by A. D. Abrams, R. C. Bausmith, K. L. Holland and S. P. Holland, assigned to the assignee of the present invention, which discloses and claims a method of forming vias in a first polyimide layer through aperatures in a second polyimide layer. The thickness of the second polyimide layer is varied in order to alter the slope of the via hole sidewalls.

BACKGROUND ART

Many methods are known for forming a patterned conductor layer on a substrate. The two most common methods of forming such a layer are subtractive etching and lift-off techniques. In subtractive etching, after a blanket conductor layer is deposited on the substrate, the layer is etched through a photomask in order to remove undesired portions thereof. In lift-off, a layer (typically an insulator such as polyimide) is deposited on a substrate, and is patterned through a photomask. The conductive layer is then deposited on the patterned insulator, and the insulator is removed from (i.e. "lifted off" of) the substrate, taking with it the undesired portions of the conductive layer. Of these two techniques, it has been found that lift-off is more desireable in that the solvents used to remove the insulator in lift-off cause less damage to the underlaying substrate than do the etch processes (e.g. a plasma etch or a reactive ion etch) used in subtractive etching. Also, the conductor profile resulting from lift-off processing minimizes step coverage problems in subsequent conductor layers.

An example of such a lift-off process is disclosed in U.S. Pat. No. 4,451,971, entitled "Lift-Off Wafer Processing", issued June 5, 1984 to Milgram and assigned to Fairchild Camera and Instrument Corp. As disclosed in this patent, a layer of pre-imidized polyimide (i.e. a copolymer of an aromatic cycloaliphatic diamine and a dianhydride) is coated on a semiconductor substrate, and a silicon dioxide barrier layer is formed on the polyimide. The barrier layer protects the polyimide layer during photolithographic processing. After these layers are patterned through a photoresist mask, a metal layer is deposited on the structure. The polyimide layer is then stripped off the silicon, lifting off the undesired portions of the metal layer. By use of the particular polyimide copolymer disclosed, the metal can be deposited at a temperature of 250° C.–300° C., reducing physical faults in the deposited metal. Note that during both the deposition and lift-off of this polyimide copolymer, a harmful organic solvent such as methylene chloride must be used.

In the article by Homma et al, "Polyimide Liftoff Technology for High-Density LSI Metallization", *IEEE Transactions on Electron Devices*, Vol. ED-28, No. 5, May 1981 pp. 552-556, a lift-off metallization process is disclosed in which a polyimide having a high imidization temperature, sold under the trade name "PIQ" by the Hitachi Chemical Co., Ltd of Japan, has an overlaying molybdenum barrier layer formed thereon. The PIQ serves as the lift-off structure (i.e. the layer which is lifted off from the underlaying layers).

In the article by Winter, "Metal Deposition With Polyimide Lift-Off Technique", *IBM Technical Disclosure Bulletin*, Vol. 17, No. 5, Oct. 1974, p. 1309, a first layer of polyimide is patterned through a photoresist mask. After the metal is deposited, the photoresist mask is removed from the first polyimide layer and a second polyimide layer is applied for passivation.

As discussed above, special polyimide layers are needed in order to carry out high temperature lift-off processes. However, these special polyimides are typically used in conjunction with overlaying barrier layers, which protect the polyimides from etching during the definition of a photoresist mask disposed on the barrier layer. It would be advantageous to eliminate these barrier layers, since they add to manufacturing cost.

SUMMARY OF THE INVENTION

It is thus an object of the invention to provide an improved metal lift-off process.

It is another object of the invention to provide a lift-off structure which is compatible with high temperature metal deposition.

It is a further object of the invention to provide an improved metal lift-off process using polyimide as the lift-off structure, wherein the polyimide layer is not protected by a barrier layer and can be processed using conventional solvents.

These and other objects of the invention are realized by a metal deposition process in which a high-temperature polyimide layer is applied to an underlaying polyimide layer. The two polyimide layers are anisotropically etched through a photoresist mask to form vias in the underlaying polyimide layer. After application of a metal layer, the high-temperature polyimide layer is lifted off the underlaying polyimide layer, which remains as a passivation layer. Note that there is no barrier layer between the high-temperature polyimide layer and the photoresist mask. The high-temperature polyimide layer can be processed using conventional solvents.

BRIEF DESCRIPTION OF THE DRAWINGS

The foregoing and other structures and teachings of the invention will become more apparent upon a description of the best mode as rendered below. In the description to follow, reference will be made to the accompanying drawing, in which.

BEST MODE FOR CARRYING OUT THE INVENTION

Figure 1:
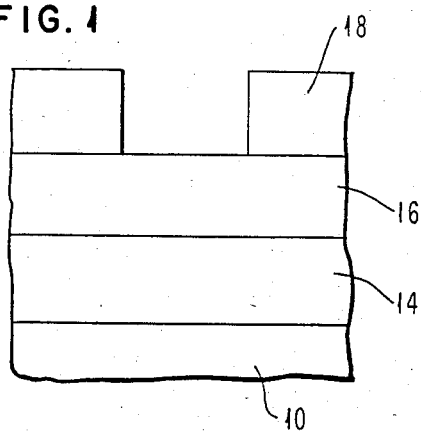
FIGS. 1–3 are cross-sectional views of a semiconductor structure undergoing the process steps of a first embodiment of the invention.
Figure 2:
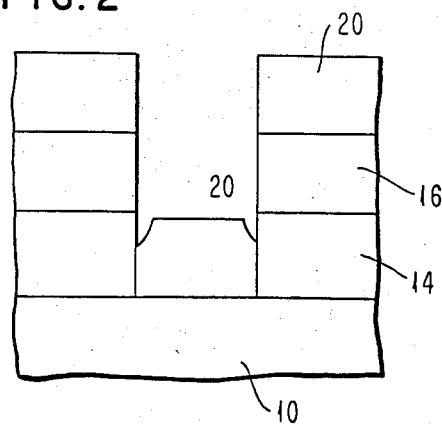
Figure 3:
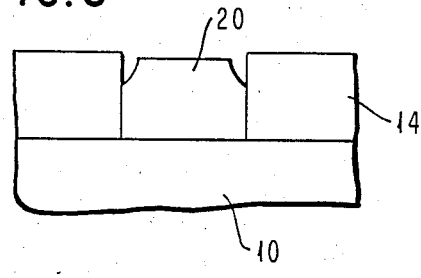

With reference to FIGS. 1–3, a first embodiment of the invention will now be described. As shown in FIG. 1, a substrate 10 has a layer of polyimide 14 spin-applied thereon. While substrate 10 is shown as being a bare silicon substrate, it is to be understood that any one of the semiconductor structures or devices currently manufactured in the industry (e.g. FET or bipolar transistors, storage capacitors, resistors, etc.) could be arranged on substrate 10, and that the patterned conductor layer to be described is patterned so as to form an electrical contact to any one of these structures. In other words, substrate 10 is shown as being bare merely for the purposes of more clearly illustrating the invention.

Polyimide layer 14 can be made up of any one of the known polyamic acid/imides that are stable up to 350° C. For example, polyimides sold under the names "PMDA-ODA" and "PI-2555" by the DuPont Company of Wilmington, Del. could be used. Polyimide layer 14 should be approximately as thick as the metal layer to be applied. For a second, third, etc. level metal, polyimide layer 14 should be approximately 1.8-2.0 $\mu$m thick. In addition to providing passivation, polyimide layer 14 produces a "step" for the metal layer to cover. This enhances discontinuities in the metal layer, facilitating lift-off as described below.

It is to be understood that this embodiment of the invention relates to the formation of any level of metallurgy on the processed substrate. If the invention is used to provide a first level of metallurgy, an additional passivating layer (e.g. silicon nitride, silicon dioxide or sputtered quartz) could be formed between polyimide layer 14 and substrate 10 for the purpose of providing additional insulation. This additional passivating layer would have to be etched separately (i.e. etched using a separate mask) from the etching of the polyimide layers as discussed below. Further, if this embodiment of the invention is used to provide via studs to structures formed on the substrate or to other metal layers, a similar passivating layer could be used which would be patterned using the same mask as the polyimide layers (only the etch ambient or plasma would have to be changed). Either way, the total thickness of the combination of polyimide 14 and the additional passivating layer should approximately equal the thickness of the metal layer to be applied. For the first level metal, the combined thickness should be 1.0-1.2 $\mu$m; for second, third, etc. level metals, the combined thickness should be 1.8-2.0 $\mu$m. The additional passivation layer can be made up of any insulator formed at a temperature which is less than the annealling temperature of underlaying conductor layers. It is emphasized that while incorporation of these additional passivation layers is preferred in that they improve reliability, they can be deleted from the process of the invention if desired.

A layer of high-temperature polyimide 16 is then spin-coated onto the surface of polyimide layer 14. Polyimide 16 can be made of any one of the known "high temperature" polyimides which do not fully imidize at temperatures below approximately 250° C.-280° C. Such polyimides are thus compatible with high-temperature metal deposition. An example of such a polyimide is Pyralin PI-2566, sold by the DuPont Company of Wilmington, Del. "Pyralin" is a trademark of the DuPont Company. Another such polyimide is sold under the trade name "PIQ" by the Hitachi Chemical Co., Ltd of Japan. These high-temperature polyimides can be distinguished from the polyimide copolymer disclosed in the Milgram patent in that these polyimides are not pre-imidized and they can be processed using solvents commonly used in the industry. Whichever of these two high-temperature polyimides is used, polyimide layer 16 should be at least as thick as the metal layer to be deposited.

The polyimide 16 should be heated to a temperature below its final cure temperature in order to facilitate subsequent etching. More specifically, it should be heated to at least 120° C. in order to harden, and preferably should be heated to approximately 200° C. in order to drive off excess solvent. For example, a 2 $\mu$m layer of PI-2566 is heated to 200° C. for approximately 20 minutes at temperature. Heating to 200° C. should be sufficient to fully imidize polyimide layer 14.

A layer of photoresist 18 is then applied to the surface of high-temperature polyimide layer 16. This layer of photoresist must be thick enough (e.g. 3 $\mu$m) such that the underlying polyimide 16 will not be attacked when the vias are etched. That is, by making the photoresist sufficiently thick, there is no need for a barrier layer in order to protect portions of the polyimide layer 16 which are not to be removed during etching. The photoresist can be made of any novolac resin-based positive photoresist. Preferably, the photoresist is chosen such that it can be exposed and developed (i.e. etched in an aqueous base such as sodium metasilicate ($Na_2SiO_3$)) as per conventional processing.

After photoresist 18 has been exposed and developed, the high-temperature polyimide 16 and polyimide 14 are anisotropically reactive ion etched (RIE) in an oxygen plasma. Note that during the course of this etch step, much or all of the photoresist 18 is consumed. See FIG. 2. Thus, vias having substantial vertical sidewalls are etched into the polyimide layer 14.

Then, as shown in FIG. 2, a 1.8-2.0 $\mu$m layer of conductive material 20 (1.0-1.2 $\mu$m for first level metal) is formed on the structure, filling the vias formed in polyimide layer 14. Conductive material 20 may consist of any of the conductive materials used in forming patterned interconnection layers in semiconductor processing (e.g. metals such as aluminum, copper, etc.; silicides of tungsten, titanium, molybdenum, etc.). A feature of the invention is that during the deposition of layer 20, substrate 10 can be heated such that the physical defects in the resulting interconnection layer (e.g. cracks, etc.) can be minimized. The substrate can be heated to temperatures of approximately 200° C.-280° C. Note that the only constraint on these deposition temperatures is that they must not be greater than the "full" imidization temperature of polyimide layer 16. In other words, during high temperature metal deposition, polyimide layer 16 should not be imidized beyond an insignificant (e.g. 2-5%) amount.

Finally, as shown in FIG. 3, high-temperature polyimide layer 16 is lifted off polyimide layer 14. This lift-off is performed by submersing the substrate in n-methyl pyrrolidone (NMP) solvent at approximately 80°-90° C. for no more than 30 minutes. Thus, the undesired portions of conductor layer 20 are removed. The remaining polyimide layer 14 serves to passivate the conductive layer. Note that polyimide layer 16 can be removed without affecting polyimide layer 14 because of the fact that polyimide 16 is not fully imidized.

As described above, the process of the first embodiment of the invention utilizes a high-temperature polyimide without a barrier layer. In addition, the invention provides a polyimide layer which passivates the patterned conductor layer.

Figure 4:
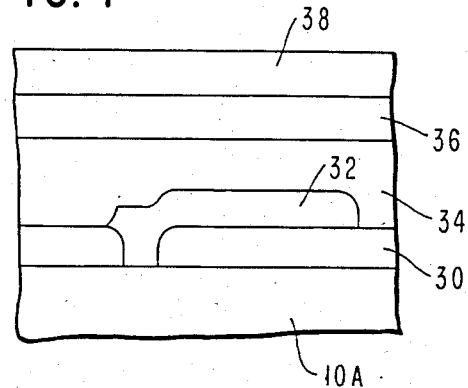
FIGS. 4–8 are cross-sectional views of a semiconductor structure undergoing the process steps of a second embodiment of the invention.
Figure 5:
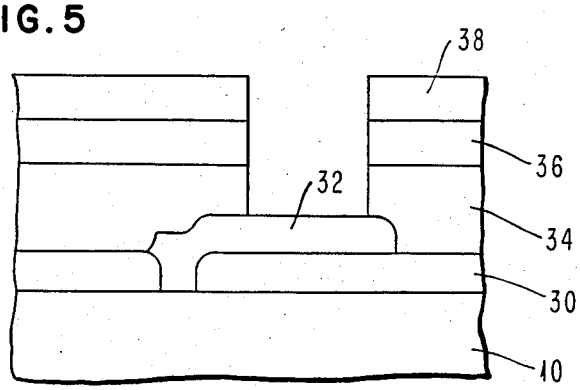

With reference to FIG. 4, a second embodiment of the invention will now be described. This embodiment relates to the formation of a patterned contact layer (i.e. a "pad metallization") which enhances the electrical contact between the final metallization level on the substrate and the chip pads (i.e. "solder balls) or wire bonds which receive signals from sources external to the chip. This contact layer also serves as a barrier layer, preventing the intermixing of the metallization metal with the chip pad or wire bond metals during the formation of the latter.

As shown in FIG. 4, an insulator layer 30 is first applied to a processed substrate 10A. A final metallization level 32 is disposed on passivation 30 and is patterned to form an elongated area which provides the electrical contact to the solder ball or wire bond to be subsequently formed. Patterned conductor 32 fills vias formed by insulation 30, and contacts semiconductor structures and/or previous patterned conductor layers formed on substrate 10A. These underlying layers/structures are omitted from FIGS. 4-8 in order to more clearly illustrate this embodiment of the invention. It is to be emphasized that while insulator layer 30 and interconnection layer 32 could be processed in the manner of the first embodiment of the invention as described above, they are not limited thereto. In other words, interconnection layer 32 and insulator layer 30 could be made up of other materials and processed in other ways in addition to those materials and process steps of the first embodiment of the present invention.

Substrate 10A is then covered by a final passivation layer 34. Passivation layer 34 can be made up of the afore-mentioned PMDA-ODA polyimide or its equivalent. Since polyimide 34 constitutes the final passivation layer, it should be relatively thick (in the order of 8 $\mu$m) in order to protect the underlying structures. After polyimide 34 is spin-coated onto the substrate, it should be solidified by heating to 110° C.–130° C. for approximately 15 minutes at temperature.

A layer of high-temperature polyimide 36 is then applied to the surface of polyimide 34. High-temperature polyimide 36 is made up of polyimides such as PI-2566 or PIQ, as discussed previously. Similarly to the first embodiment of the invention, the high-temperature polyimide 36 should be approximately as thick (e.g. 2-3 $\mu$m) as the pad metallurgy to be subsequently formed. Similarly to polyimide 34, the high-temperature polyimide 36 should be solidified by heating to 110°–130° C. for approximately 15 minutes at temperature.

A photoresist layer 38 is then deposited onto high-temperature polyimide layer 36. The photoresist should be a positive photoresist as described in the first embodiment of the invention.

The positive photoresist is exposed and developed as per conventional processing, using aqueous bases such as potassium hydroxide (KOH) or tetramethyl-ammonium hydroxide (TMAH). A feature of this embodiment of the invention is that by using a positive photoresist and the above-described etchants, the polyimide layers can be etched as the positive photoresist is developed. In other words, the photoresist is patterned and openings are created in the underlying polyimide layers during the course of a single wet etch step. See FIG. 5.

Figure 6:
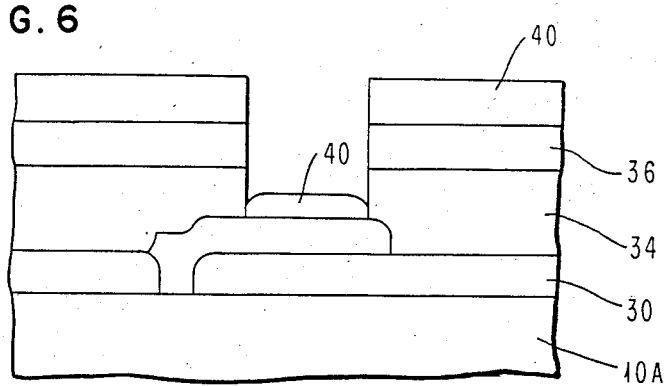

Then, as shown in FIG. 6, the positive photoresist 38 is removed using n-butyl acetate or any other solvent (e.g. iso-propyl alcohol or acetone) which removes photoresist without appreciably attacking underlaying polyamic acids such as polyimide. Note that this removal step is not necessary, in that the photoresist could be removed as polyimide layer 36 is lifted off (as described below). By removing the photoresist separately, lift-off can be carried out more efficiently. After photoresist removal, the polyimide layers are heated to approximately 200° C., which is sufficient to fully imidize (i.e. achieve at least 98% imidization) polyimide layer 34 and to imidize high-temperature polyimide layer 36 by an inconsequential (2-5%) amount.

The aperatures formed in the polyimide layers are then briefly etched, using either plasma or wet etch techniques, in order to remove any impurities. A suitable wet etchant would be chromic-phosphoric acid, and a suitable atmosphere for plasma etching would be $CF_4$ or $CF_4+O_2$. Again, while this step is not absolutely necessary, it contributes to the reliability of the overall process.

As shown in FIG. 6, a conductor layer 40 is then deposited. This metallurgy (e.g. a combination of chromium, copper and gold or titanium, copper and gold) enhances the contact between the wire bond or solder ball to be subsequently formed and patterned conductor layer 32, while also providing an intermixing barrier therebetween. As in the first embodiment of the invention, the substrate 10A should be heated to 200°–280° C. during deposition in order to minimize the defects in the pad metallurgy layer. Note that other metals (e.g. aluminum) could be used here.

Figure 7:
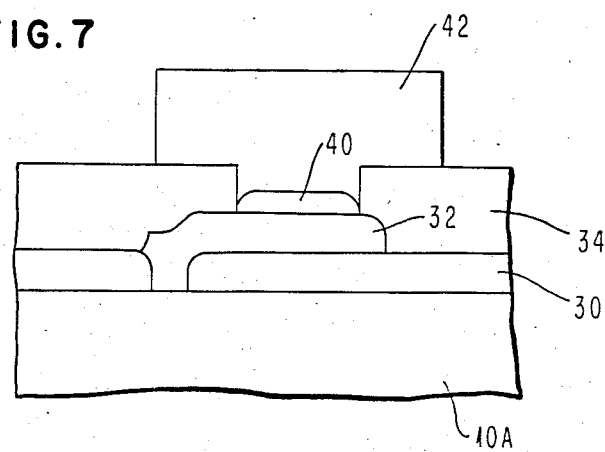

Then, as shown in FIG. 7, undesired portions of the conductor layer 40 are removed by lifting off high-temperature polyimide layer 36 from polyimide layer 34, leaving behind pad metallurgy 40A. As in the first embodiment of the invention, the different solubility characteristics of the two polyimide films are produced by the extent to which they are imidized during the course of previous processing steps (i.e. recall the cure step in which polyimide 34 is fully imidized while high-temperature polyimide 36 is not appreciably imidized). Polyimide 36 is then stripped using n-methyl-pyrrolidone at 80°–95° C. for 30 minutes at temperature.

Finally, the lead-tin solder balls 42 are deposited on pad metallurgy 40A, using well known techniques (e.g. evaporating the solder through a metal mask), resulting in the structure as shown in FIG. 7. Alternatively, a wire bond metallurgy could be deposited on pad metallurgy 40A, again using conventional techniques.

Figure 8:
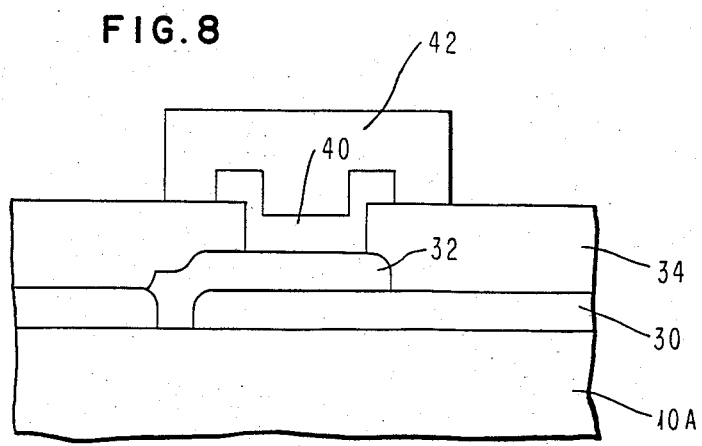

The second embodiment of the invention as described above can be modified as follows. In order to insure that sufficient contact is made between solder ball 42 and pad metallurgy 40A, it may be advantageous to configure the upper surface of pad metallurgy 40A such that it overflows the vias formed in passivating polyimide layer 34. In order to do this, the process can be altered by eliminating the positive resist strip. Immediately before the vias are etched in order to remove impurities, briefly expose the structure to TMAH or KOH solvents for a time sufficient to etch back the sidewalls of the opening formed in high-temperature polyimide layer 36 without appreciably affecting the vias in polyimide 34. Thus, upon application of conductor layer 40A, the metal will overflow the vias in polyimide 34 by a controllable amount (i.e. the extent to which the sidewalls of the aperature in polyimide 36 were etched back). The process is then completed as described, resulting in a structure as shown in FIG. 8.

As described above, both embodiments of the invention present a method by which high-temperature polyimide layers are used to form a lift-off structure without the need for a barrier layer. The first embodiment of the invention provides an efficient method of forming patterned interconnection layers, and the second embodiment of the invention provides an efficient method of providing an interconnection between the final metallization layer and the solder balls or wire bonds.

It is to be understood that while modifications can be made by a person of ordinary skill in the art to the best mode as described above, such modifications fall within the general scope of the present invention.

We claim:

1. A process for forming a patterned interconnection layer on a processed semiconductor substrate, comprising the steps of:
    forming a first polyimide layer on the processed substrate;
    forming a high-temperature polyimide layer on said first polyimide layer;
    forming a photoresist layer on said high-temperature polyimide layer;
    exposing said photoresist layer and developing said photoresist layer in a solvent which does not appreciably attack said high-temperature polyimide layer;
    etching said high-temperature polyimide layer and said first polyimide layer through said developed photoresist layer to form vias in said first polyimide layer, said high-temperature polyimide layer and said first polyimide layer etching at substantially the same rate, said photoresist layer being substantially removed during said etching step;
    forming a conductor layer on said substrate, said conductor layer at least partially filling said vias formed in said first polyimide layer, said conductor layer being formed under high temperature conditions; and
    lifting off said high temperature polyimide layer from said first polyimide layer in order to remove undesired portions of said conductor layer.

2. The process as recited in claim 1, wherein said high-temperature polyimide layer and said conductor layer have substantially the same thicknesses.

3. The process as recited in claim 1, wherein said high-temperature polyimide layer is comprised of a polyimide material which does not fully imidize at temperatures below approximately 250°–280° C.

4. The process as recited in claim 3, wherein prior to said step of forming said photoresist layer on said high-temperature polyimide layer, said first polyimide layer is substantially imidized without appreciably imidizing said high-temperature polyimide layer.

5. The process as recited in claim 1, wherein said photoresist layer is developed in a solvent comprising sodium metasilicate.

6. The process as recited in claim 1, wherein said step of etching said high-temperature polyimide layer and said first polyimide layer is carried out using reactive ion etching in an oxygen ambient.

7. The process as recited in claim 1, wherein said substrate is heated to a temperature below the imidization temperature of said high-temperature polyimide layer during said step of forming said conductor layer on said substrate.

8. The process as recited in claim 1, wherein said step of lifting off said high-temperature polyimide layer is carried out using n-methyl pyrrolidone as the solvent.

9. A process of forming a patterned conductor layer on the surface of a processed semiconductor substrate having active and passive devices formed thereon and a patterned passivation layer formed on the devices, comprising the steps of:
    forming a first polyimide layer on the patterned passivation layer of the processed semiconductor substrate;
    forming a second polyimide layer on said first polyimide layer and heating said second polyimide layer in order to remove excess solvent therefrom, said second polyimide layer having an imidization temperature of approximately 250°–280° C.;
    forming a positive photoresist layer on said second polyimide layer;
    exposing said positive photoresist layer and developing said positive photoresist layer in an aqueous base which does not appreciably attack said second polyimide layer;
    anisotropically etching said second polyimide layer and said first polyimide layer through said developed positive photoresist so as to form vias having substantially vertical sidewalls in said first polyimide layer, said vias being aligned with openings in said patterned passivation layer, said second and first polyimide layers etching at substantially the same rate;
    forming a conductor layer on the processed semiconductor substrate, said conductor layer at least partially filling said vias, the semiconductor substrate being held at a temperature of at least 200° C. during formation of said conductor layer so as to minimize physical defects in said conductor layer; and
    removing undesired portions of said conductor layer and remaining portions of said positive photoresist layer atop said second polyimide layer by submersing the processed semiconductor substrate in a solvent which attacks said second polyimide layer without appreciably attacking said first polyimide layer.

10. The process as recited in claim 9, wherein the patterned passivation layer comprises an insulator which can be formed at a temperature below the anneal temperature of any underlying conductors.

11. The process as recited in claim 10, wherein said insulator is selected from the group consisting of silicon nitride, silicon dioxide, and sputtered quartz.

12. A process of forming an interconnection structure for coupling a metallization level of a processed semiconductor substrate to a conductor coupled to an external signal source, comprising the steps of
    forming a first polyimide layer on said metallization level of the semiconductor substrate;
    forming a second polyimide layer on said first polyimide layer;
    forming a layer of photoresist on said second polyimide layer;
    exposing said photoresist and developing said photoresist in an aqueous base which attacks said second and first polyimide layers so as to form vias in said first polyimide layer to a selected portion of said metallization level;
    heating the substrate to a temperature sufficient to substantially imidize said first polyimide layer and insubstantially imidize said second polyimide layer;
    depositing a conductor layer on said second polyimide layer under high temperature conditions, said conductor layer at least partially filling said vias; and
    lifting off said second polyimide layer from said first polyimide layer in order to remove portions of said conductor layer lying outside said vias.

13. The process as recited in claim 12, wherein said aqueous base is selected from the group consisting of KOH and TMAH.

14. The process as recited in claim 12, wherein said step of curing said first and second polyimide layers is carried out at a temperature within the range of 200°–280° C.

15. The process as recited in claim 12, wherein said first and second polyimide layers are solidified by heating to 110° C.–130° C. immediately after formation.

16. The process as recited in claim 12, wherein said second polyimide layer is lifted off said first polyimide layer by submersing said second polyimide layer in an n-methyl pyrrolidone solvent.

17. The process as recited in claim 12, wherein said conductor layer comprises a combination of chromium, copper and gold.

18. The process as recited in claim 12, wherein said conductor layer comprises a combination of titanium, copper and gold.

19. A method of forming wire bond contacts which connect the final metallization level of a processed semiconductor substrate to at least one external signal source, comprising the steps of:
   forming a first polyimide layer on the final metallization layer;
   forming a high-temperature polyimide layer on said first polyimide layer;
   forming a positive photoresist layer on said high-temperature polyimide layer;
   exposing said positive photoresist and developing said exposed positive photoresist in an aqueous base which attacks said high-temperature polyimide layer and said first polyimide layer to form vias in said first polyimide layer, said high-temperature polyimide layer and said first polyimide layer etching at substantially the same rate;
   removing said positive photoresist layer;
   heating the substrate so as to substantially imidize said first polyimide layer and insubstantially imidize said high-temperature polyimide layer;
   depositing a layer of a first conductive material onto said substrate, said first conductive material at least partially filling said vias in said first polyimide layer, said substrate being heated to a temperature below the full imidization temperature of said high-temperature polyimide layer during said deposition of said conductive material;
   lifting off the high-temperature polyimide layer from said first polyimide layer in order to remove portions of said conductive material lying outside said vias; and
   forming the wire bond contacts on remaining portions of said conductive material.

20. A method of forming a solder ball contact which connects the metallization levels of the semiconductor substrate to at least one external signal source, comprising the steps of:
   passivating the final metallization layer by spin-applying a first polyimide layer thereon;
   spin-applying a high-temperature polyimide layer onto said first polyimide layer, said first polyimide layer being thicker than said high-temperature polyimide layer;
   spin-applying a layer of positive photoresist onto said high-temperature polyimide layer;
   exposing said positive photoresist and developing said exposed positive photoresist in an aqueous base which attacks said high-temperature polyimide layer and said first polyimide layer to form vias in said first polyimide layer without appreciably attacking the underlying metallization level, said high-temperature polyimide layer and said first polyimide layer etching at substantially the same rate;
   removing said positive photoresist with a solvent which does not appreciably attack the underlying layers;
   heating the substrate to approximately 200° C. for approximately 15–20 minutes, which is sufficient to fully imidize said first polyimide layer and insubstantially imidize said high-temperature polyimide layer;
   depositing a layer of conductive material on said high-temperature polyimide layer, said substrate being heated to 200°–280° C. during said deposition of said conductive material in order to minimize physical defects therein, said conductive material substantially filling said vias formed in said first polyimide layer to form a pad metallurgy in said vias;
   lifting off the high temperature polyimide layer from said first polyimide layer in order to remove portions of said conductive material lying outside said vias; and
   depositing solder through a mask in order to form the solder ball contacts on said pad metallurgy.

21. A method of forming a pad metallurgy which provides a conductive intermixing barrier between the metallization levels of a processed semiconductor substrate and the wire bond or solder ball contacts coupled to at least one external signal source, comprising the steps of:
   passivating a final one of the metallization levels of the processed semiconductor substrate by spin-coating a first polyimide layer thereon;
   forming a high-temperature polyimide layer on said first polyimide layer, said high-temperature polyimide layer having a full imidization temperature within the range of 250°–280° C.;
   forming a positive photoresist layer on said high-temperature polyimide layer;
   exposing said positive photoresist and developing said exposed positive photoresist in an aqueous base which attacks said high-temperature polyimide layer and said first polyimide layer to form aperatures in said high-temperature polyimide layer and vias through said first polyimide layer to an elongated portion of said final metallization level, said high-temperature polyimide layer and said first polyimide layer etching at substantially the same rate;
   heating the substrate so as to substantially imidize said first polyimide layer and insubstantially imidize said high-temperature polyimide layer;
   etching said high-temperature polyimide through said positive photoresist in order to etch back the sidewalls of said aperatures in said high-temperature polyimide layer without appreciably attacking said first polyimide layer or said final metallization level;
   depositing a first layer of conductive material on said high-temperature polyimide under high temperature conditions, said first layer of conductive material at least partially overflowing said vias in said first polyimide layer to form a pad metallurgy; and
   lifting off the high-temperature polyimide layer from said first polyimide layer in order to remove undesired portions of said conductive material lying outside said vias.

* * * * *